United States Patent
Bornhofft et al.

Patent Number: 6,124,713
Date of Patent: Sep. 26, 2000

[54] MATCHING AMPLIFIER HAVING AN EXTREMELY HIGH INPUT RESISTANCE FOR AN INDUCTION PROBE

[75] Inventors: Wolfgang Bornhofft, Seevetal; Gerhard Trenkler, Barsbüttel, both of Germany

[73] Assignee: STN Atlas Elektronik GmbH, Bremen, Germany

[21] Appl. No.: 08/990,742

[22] Filed: Dec. 15, 1997

[30] Foreign Application Priority Data

Dec. 13, 1996 [DE] Germany ............... 196 51 922

[51] Int. Cl.[7] .................. G01R 33/02; G01V 3/00; G01V 3/08
[52] U.S. Cl. ................... 324/345; 324/258
[58] Field of Search .................. 324/258, 225, 324/244, 260, 261, 331, 345

[56] References Cited

U.S. PATENT DOCUMENTS

| | | |
|---|---|---|
| 3,126,510 | 3/1964 | McLaughlin et al. ............... 324/252 |
| 3,471,777 | 10/1969 | Rona . |
| 4,703,266 | 10/1987 | Chiron et al. . |
| 5,150,051 | 9/1992 | Fiedman et al. ............... 324/258 |
| 5,512,823 | 4/1996 | Nepveu . |

FOREIGN PATENT DOCUMENTS

| | | |
|---|---|---|
| 2 352 304 | 12/1977 | France . |
| 26 25 964 B1 | 12/1977 | Germany . |
| 31 09 212 A1 | 9/1986 | Germany . |

*Primary Examiner*—Walter E. Snow
*Attorney, Agent, or Firm*—Venable; Norman N. Kunitz

[57] ABSTRACT

A matching amplifier for an induction probe which detects low-frequency alternating magnetic fields of floating bodies propagating in water. The matching amplifier has an isolating amplifier and a frequency response-determining network, with the network being provided with a frequency pass region having a band-pass characteristic and an integrating response in the band pass for the purpose of canceling the decorrelation of the measuring values emitted by the induction probe, with the integrating response being matched to compensate for the decorrelation of the measuring signal of the induction probe generated by the differentiating effect of the induction probe.

14 Claims, 2 Drawing Sheets

MATCHING AMPLIFIER HAVING AN EXTREMELY HIGH INPUT RESISTANCE FOR AN INDUCTION PROBE

REFERENCE TO RELATED APPLICATIONS

This application is related to the applicants commonly assigned concurrently filed U.S. patent application Ser. No. 08/990,743, filed Dec. 15, 1997, now U.S. Pat. No. 6,002, 253, corresponding to German Patent application No. 196 51 923.3, filed Dec. 13, 1996, the subject matter of which is incorporated herein by reference.

This application claims the priority of German application No. 196 51 922.5 filed Dec. 13, 1996, the subject matter of which is incorporated herein by reference.

BACKGROUND OF THE INVENTION

The invention relates to a matching or adapter amplifier for an induction probe for the detection of alternating magnetic fields which are emitted by magnetic field sources disposed in water, in particular, by floating bodies. More particularly, the present invention relates to such an amplifier which comprises an operational amplifier which is configured as an isolating amplifier and a frequency response-determining network.

It is known to detect alternating magnetic fields propagating in water by means of induction probes and to draw conclusions with respect to the magnetic field source by way of suitable processing of the measuring signals produced by the induction probes. Magnetic fields of this type are generated, for example, by floating bodies, which may be, for example, a submarine or a torpedo. In the case of a submarine, such alternating magnetic fields are generated, for example, by the propelling unit, the electric motor, the corrosion currents modulated by the turn of the propeller and by data processing systems in which software programs are run with different loading cycles and which modulate the currents that flow within the data processing system. These primary alternating magnetic fields emitted by such a floating body are of low frequency and characterized by a stochastic signal character.

With the assistance of probes of this type, it is possible to detect magnetic field sources in water from a distance of several hundred meters. If at least two induction probes are used, it is then possible to obtain, from the measuring signals of both probes, distance and direction information with respect to the magnetic field source, that is, to locate the magnetic field source. For this purpose, the measuring signals that are present at the output of such induction probes must be evaluated with respect to their relationship to one another.

The measuring signal of an induction probe corresponds to the differentiation over time of the magnetic induction. During this process, the stochastic signal portions that are disposed in the covered alternating field of the magnetic induction are decorrelated. If these decorrelated signal portions are now evaluated with respect to their relationship to one another, this leads to extreme position finding errors. In order to avoid such position finding errors, it is therefore indispensable to assure the synchronous operation of the at least two induction probes with respect to their amplitude response and phase response.

Since an adapter or matching amplifier is usually also connected downstream of the probes, a synchronous operation of the adapter amplifiers is also indispensable for the evaluation of the output signals of two probes. A known adapter or matching amplifier of the type mentioned at the outset is disclosed in German Patent No. DE 26 25 964 C3 and is provided with an input stage which acts as isolating amplifier, a 16 ⅔ Hz trap circuit for the suppression of interferences from the operation of electric railway locomotives, and a 10 Hz low-pass filter for the suppression of higher-frequency signal portions or components such as, e.g., of the network frequency 50 Hz. All three stages are implemented with low-noise integrated semiconductor amplifiers. An adapter or matching amplifier of this type cannot counteract the decorrelation of stochastic signal portions taking place in the induction probe.

It is the object of the invention to provide an adapter or matching amplifier of the type mentioned at the outset for induction probes for detecting, in particular, low-frequency alternating fields, with the adapter or matching amplifier amplifying the measuring signals emitted by the induction probe in such a way that these can be placed into relationship with respect to one another in the proper amplitude and phase, and that the evaluation of this relationship results in useful measuring results with a low error tolerance.

SUMMARY OF THE INVENTION

The above object generally is achieved according to the present invention by a matching amplifier for an induction probe for the detection of alternating magnetic fields which are emitted by magnetic field sources disposed in water, in particular, by floating bodies, said matching amplifier comprising: an operational amplifier configured as an isolating amplifier, and a frequency response-determining network, wherein the network is provided with a frequency pass region having a band-pass characteristic and an integrating response in the band pass that is matched to compensate for the decorrelation of the measuring signal generated by the differentiating effect of the induction probe.

The matching amplifier according to the invention offers the advantage that the decorrelation of the measuring signals in the adapter amplifier caused by the differentiation characteristic or behavior of the induction probe is canceled by limiting the frequency range to a selected pass band and by the integrating characteristic or behavior of the network in the pass band. The measuring signals that are compensated in this manner in the adapter amplifier can thus be put into relationship with respect to one another in the proper amplitude and phase for a majority of frequency intervals or frequency windows disposed in the pass band and thus the distance from the magnetic field source can be determined with relative precision, for example, by way of forming sums and differences and by subsequent quotient formation from sum and difference of the compensated measuring signals of two induction probes.

Useful embodiments of the matching amplifier according to the invention with advantageous modifications and features of the invention are disclosed and discussed below.

The invention is described in greater detail below by way of an embodiment illustrated in the drawing.

DETAILED DESCRIPTION OF THE PREFERRED EMBODIMENTS

Figure 1:
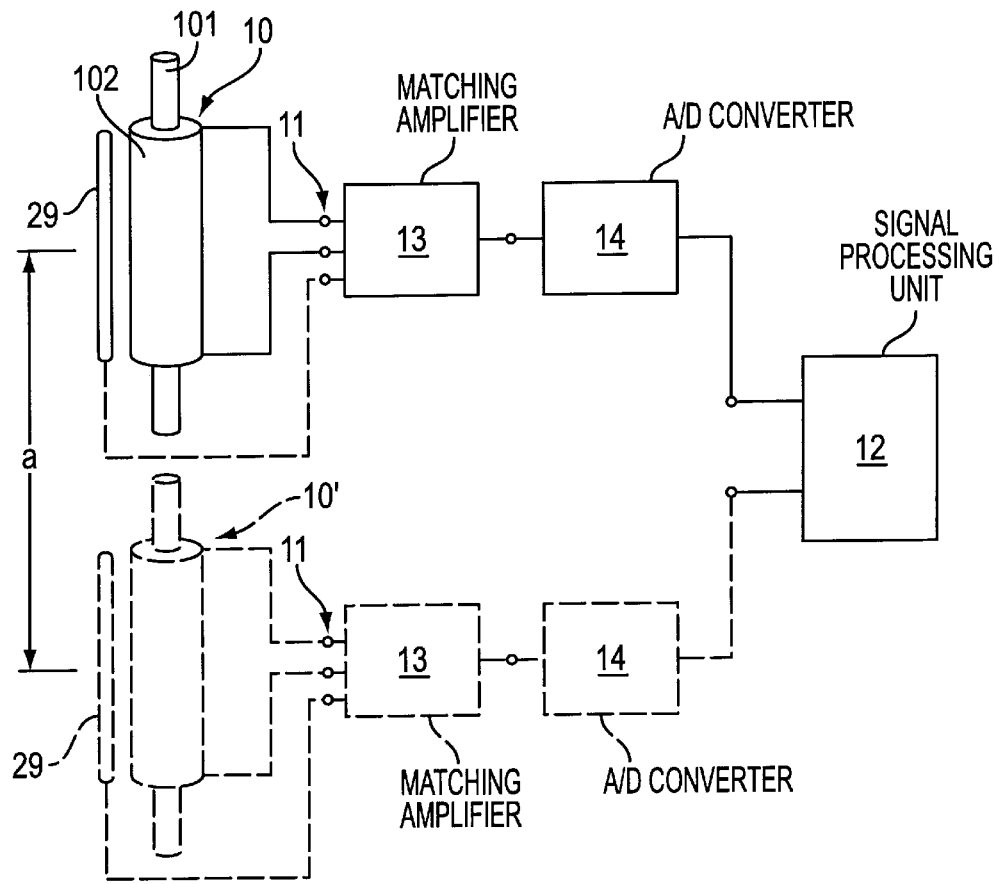
FIG. 1 a block diagram of a measuring arrangement for detecting low-frequency alternating magnetic fields using matching amplifiers according to the invention.

The measuring arrangement, which is illustrated in the block diagram of FIG. 1, for detecting low-frequency alternating magnetic fields such as emitted into water by floating bodies such as a submarine or torpedo, is provided with at least one induction probe 10 with a highly permeable probe core 101 and a measuring winding 102 surrounding the probe core 101. The design and operation of the induction probe 10 are described, for example, in German Patent No. DE 26 25 964. This induction probe 10 measures the induction of the alternating magnetic field and generates corresponding measuring signals at its voltage output 11. By means of an electronic signal processing unit 12, information on the magnetic field source emitting the alternating magnetic field is determined from the measuring signals. For this purpose, the measuring output 11 of the induction probe 10 is connected to the electronic signal processing unit 12 via an adapter amplifier 13 and an analog/digital converter 14. If it is also intended to determine the position of the magnetic field source by means of the measuring arrangement, that is, if its location is to be determined according to distance and direction with respect to the measuring arrangement, at least two induction probes 10, 10' must be arranged in the measuring arrangement at a defined distance a from one another. The measuring output 11 of each induction probe 10, 10' is connected to the electronic signal processing unit 12 via a separate adapter or matching amplifier 13 and a separate analog/digital converter 14. The required second induction probe 10' is indicated in dashed lines in FIG. 1. The measuring signal that is present at the measuring output 11 of the induction probe 10 corresponds to the derivative over time of the magnetic induction or flux according to $$U_{probe} \sim \frac{d B(t)}{d t}, \quad (1)$$

with B(t) being the magnetic induction or flux, and $U_{probe}$ being the measuring signal that is applied as a voltage signal at the measuring output 11 of the induction probe 10. The stochastic signal portions comprised in B(t) are decorrelated because of this differentiation of the magnetic induction or flux B(t).

The adapter or matching amplifier 13 has an operational amplifier acting as an isolating amplifier as well as a frequency response-determining network. In order to compensate the above-described decorrelation of the stochastic signal portions, the network determining the frequency response has a band-pass characteristic with a pass band between a lower frequency $f_u$ and an upper frequency $f_o$ and has an integrating response in the pass band, thus compensating the measuring signal of the induction probe 10 according to $$B(t) = \int U_{probe} \cdot d t = \int \frac{d B(t)}{d t} d t. \quad (2)$$

Figure 2:
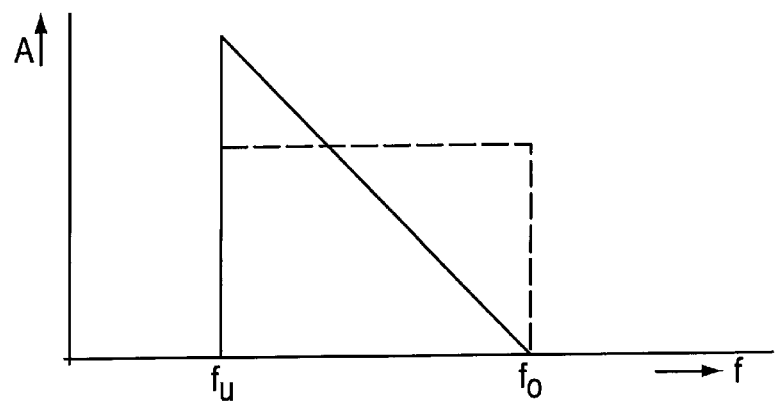
FIG. 2 a diagram of a typified example of the frequency response of a matching amplifier according to the invention in the measuring arrangement of FIG. 1.

FIG. 2 illustrates a typified example of the frequency response of the network with its band-pass characteristic between the frequency limits $f_u$ and $f_o$ and the additionally introduced integrating response. In a preferred embodiment of the matching amplifier 13, the lower limiting frequency $f_u$ is determined to be at approximately 0.1 Hz and the upper limiting frequency $f_o$ at approximately 30 Hz.

The matching amplifier 13 with isolating amplifier and network is designed such that it has an extremely high input resistance or impedance, a small input capacitance relative to the inherent capacitance of the induction probe 10, and a minimum inherent noise which is much lower than the resistance noise generated by the induction probe 10. Moreover, the integrating portion of the network is designed such that the amplifier output is not overdriven by interference signals of the 16 ⅔ Hz frequency or a multiple thereof contained in the measuring signal.

Figure 3:
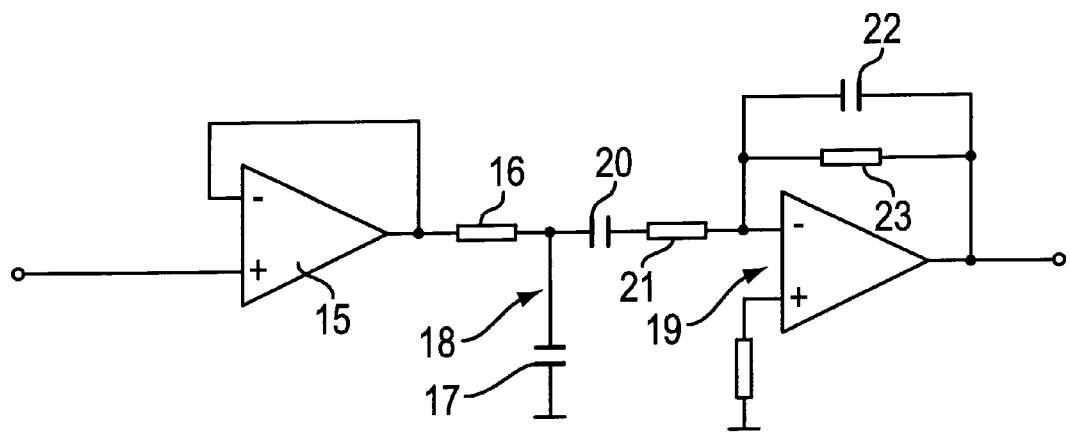
FIGS. 3 and 4 each show a schematic circuit diagram of a matching amplifier in the measuring arrangement of FIG. 1 according to two embodiments of the invention.

One embodiment of the adapter or matching amplifier 13 with isolating amplifier and network is illustrated in FIG. 3. Here, the operational amplifier is designed as electrometer amplifier 15 having an integrating element 18 comprised of a series resistor 16 and a shunt capacitor 17 connected downstream or to the output of the amplifier 15. An amplifier 19 with a band-pass characteristic is connected to the integrating element 18. In particular, the negated or inverting input of the amplifier 19 is connected with the integrating element 18 via a series connection comprised of a capacitor 20 and a resistor 21. A parallel connection comprised of a capacitor 22 and a resistor 23 is arranged or connected in the feedback branch of the amplifier 19. The measuring output 11 of the induction probe 10 is directly connected to the non-inverting input of the electrometer amplifier 15. If an FET operational amplifier is used for the amplifier 15, the induction probe 10 is not loaded and thus its frequency is not changed.

Figure 4:
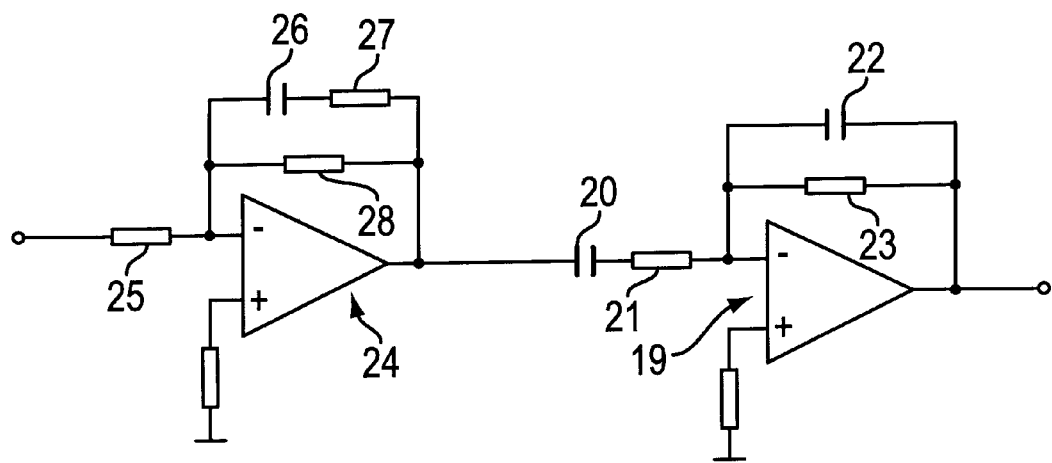

In the embodiment of the matching amplifier 13 shown in FIG. 4, the electrometer amplifier 15 and integrating element 18 are replaced by an integrating amplifier 24, thus resulting in a series connection comprised of the integrating amplifier 24 and the amplifier 19 with band-pass characteristic. The amplifier 19 with band-pass characteristic is designed identically to that in FIG. 3, so that identical components are provided with the same reference numerals. The measuring output 11 of the induction probe 10 is guided via a resistor 25 to the inverting input of amplifier 24 whose integrating response is accomplished by a feedback branch in which a series connection comprised of a capacitor 26 and a resistor 27 is connected in parallel with a resistor 28. Such a design of the matching amplifier 13 is especially preferred because, here, the matching amplifier 13 can be provided with a high input resistance, which is, e. g., one hundred times greater than the internal resistance of the induction probe 10, and with a low input capacitance, which amounts approximately to only the 0.1 multiple of the probe capacitance. Furthermore, the integrating network portion disposed in the feedback of the integrating amplifier 24 can be designed such that the output of the adapter amplifier 13 is not overdriven, that is, run into saturation, by environment-related interference signals that are measured by the induction probe 10, e. g., of the 16 ⅔ Hz frequency (path current supply) from the operation of automotive railroad locomotives and its multiple, e. g., 50 Hz (power or volt/current supply). This data changes into 60 Hz for the U.S. territories using a 60 Hz supply.

It is advantageous to install the matching amplifier 13 in a common housing together with the induction probe 10. Preferably, the power supply should also be incorporated into the housing by means of an associated battery so as to suppress disturbing influences which might be coupled into the induction probe 10 from the outside via possible power supply lines. If the matching amplifier 13, is operated with a battery, the current consumption of the matching amplifier 13 must then be reduced to accomplish a long service life.

In order to reduce the inherent capacitance of the induction probe 10, the induction probe 10 is often provided with so-called potential surfaces 29. Such potential surfaces 29 may be arranged between the probe core 101 and the measuring winding 102 or between the measuring winding 102 and the housing but also, if the measuring winding 102 is divided into individual coils, between the individual winding coils. To set different potentials at the potential surfaces 29, the matching amplifier 13 must also be provided with a functional unit, not shown, which is connected with the potential surfaces 29 (as is indicated in FIG. 1 with dashed lines) so as to apply the corresponding voltage potentials to the potential surfaces 29. In the simplest case, this functional unit is configured as a voltage divider.

The invention now being fully described, it will be apparent to one of the ordinary skill in the art that any changes and modifications can be made thereto without departing from the spirit or scope of the invention as set forth herein.

What is claimed:

1. A matching amplifier for an induction probe for the detection of alternating magnetic fields which are emitted by magnetic field sources disposed in water, in particular, by floating bodies, said matching amplifier comprising: an operational amplifier configured as an isolating amplifier, and a frequency response-determining network, and wherein the network is provided with a frequency pass region having a band-pass characteristic, and an integrating response in the band-pass that is matched to compensate for the decorrelation of the measuring signal produced by the differentiating effect of the induction probe.

2. A matching amplifier for an induction probe for the detection of alternating magnetic fields which are emitted by magnetic field sources disposed in water, in particular by floating bodies, said matching amplifier having an extremely high input resistance and a low input capacitance relative to the inherent capacitance of the induction probe and comprising an operational amplifier configured as an isolating amplifier having an input for connection to the probe, and a frequency response-determining network connected to the operational amplifier, and wherein the network is provided with a frequency pass region having a band-pass characteristic, and an integrating response in the bandpass characteristic, and an integrating response in the bandpass that is matched to compensate for the decorrelation of the measuring signal produced by the differentiating effect of the induction probe.

3. A matching amplifier according to claim 2, wherein the integrating portion of the network is connected downstream of the operational amplifier in a signal flow direction.

4. A matching amplifier according to claim 3, wherein:

the operational amplifier is an electrometer amplifier; the integrating portion connected downstream of the operational amplifier is comprised of a series resistor and a shunt capacitor; and an amplifier with a band pass characteristic is connected to the integrating portion.

5. A matching amplifier according to claim 1, wherein the integrating portion of the network is connected downstream of the operational amplifier in a signal flow direction.

6. A matching amplifier according to claim 5, wherein the operational amplifier is an electrometer amplifier; the integrating portion connected downstream of the operational amplifier is comprised of a series resistor and a shunt capacitor; and an amplifier with a band pass characteristic is connected to the integrating portion.

7. A matching amplifier according to claim 1, wherein the integrating portion of the network is connected in a feedback branch of the operational amplifier.

8. A matching amplifier according to claim 7, wherein the integrating portion of the network is such that the amplifier output is not overdrive by environmental interference signal (s) frequency from the operation of electric railway locomotive and a multiple thereof found in the measuring signal.

9. A matching amplifier according to claim 7, wherein said matching amplifier comprises the series connection of the operational amplifier, which is an integrating amplifier, and an amplifier with the band pass characteristic, with the integrating response of the integrating amplifier being matched to the frequency band of the amplifier with band pass characteristic.

10. A matching amplifier according to claim 2, wherein the integrating portion of the network is connected in a feedback branch of the operational amplifier.

11. A matching amplifier according to claim 1, wherein the matching amplifier has a minimum inherent noise which is lower than the resistance noise generated by the induction probe.

12. A matching amplifier according to claim 1 for an induction probe having potential surfaces for reducing the inherent capacitance, and further comprising a functional unit for generating different voltage potentials at the potential surfaces.

13. A matching amplifier according to claim 12, wherein the functional unit is comprised of at least one voltage divider.

14. A measuring arrangement comprising: at least two induction probes disposed at a distance (a) from one another for detecting alternating magnetic fields emitted by magnetic field sources disposed in water; a respective matching amplifier according to claim 1 associated with each of the induction probes; and circuit means for combining and evaluating the output signals from the matching amplifiers.

* * * * *